United States Patent
Zhang et al.

(10) Patent No.: US 7,169,637 B2
(45) Date of Patent: Jan. 30, 2007

(54) ONE MASK PT/PCMO/PT STACK ETCHING PROCESS FOR RRAM APPLICATIONS

(75) Inventors: Fengyan Zhang, Vancouver, WA (US); Lisa H. Stecker, Vancouver, WA (US); Bruce D. Ulrich, Beaverton, OR (US); Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 321 days.

(21) Appl. No.: 10/883,228

(22) Filed: Jul. 1, 2004

(65) Prior Publication Data
US 2006/0003489 A1 Jan. 5, 2006

(51) Int. Cl.
*H01L 21/06* (2006.01)
*H01L 21/461* (2006.01)

(52) U.S. Cl. .................. 438/102; 438/734; 438/381; 438/382; 438/781; 438/782; 257/E21.49

(58) Field of Classification Search .............. 438/102, 438/734, 381–2, 781–2
See application file for complete search history.

(56) References Cited

U.S. PATENT DOCUMENTS 6,774,004 B1* 8/2004 Hsu et al. ............... 438/382
6,774,054 B1* 8/2004 Zhang et al. ............ 438/781
2005/0079727 A1* 4/2005 Zhang et al. ............ 438/734

* cited by examiner

*Primary Examiner*—Richard Elms
*Assistant Examiner*—Mohsen Ahmadi
(74) *Attorney, Agent, or Firm*—Robert D. Varitz, PC

(57) ABSTRACT

A one-mask etching method for use with a PCMO-containing RRAM to reduce stack side-wall residuals, includes preparing a substrate, taken from the group of substrates consisting of silicon, silicon dioxide and polysilicon; depositing a bottom electrode on the substrate; depositing a PCMO layer on the bottom electrode; depositing a top electrode on the PCMO layer; depositing a hard mask on the top electrode; depositing and patterning a photoresist layer on the hard mask; etching the hard mask; etching the top electrode using a first etching process having an etching atmosphere consisting of Ar, $O_2$, and $Cl_2$; etching the PCMO layer using an etching process taken from the group of etching processes consisting of the first etching process and a second etching process having an etching atmosphere consisting of Ar and $O_2$. etching the bottom electrode using the first etching process; and completing the RRAM device.

26 Claims, 2 Drawing Sheets

ONE MASK PT/PCMO/PT STACK ETCHING PROCESS FOR RRAM APPLICATIONS

FIELD OF THE INVENTION

This invention relates to etching processes, and specifically to a dry etching process for a Pt/PCMO/Pt stack for use in resistor random access memory (RRAM) applications. The method of the invention may also be applied to DRAMs, capacitors, sensors, optical displays, optical switches, transducers, imagers and other magnetic devices.

BACKGROUND OF THE INVENTION $Pr_xCa_{1-x}MnO_3$ (PCMO) metal oxide is difficult to etch using a dry etching processes. It has been reported that dry etching of PCMO using chemistries of chlorine and argon is somewhat workable, but the etch rate is very low and very little of the mask survives the etching process, leading to etching of portions of a device where etching is not desired. It has also been reported that dry etching using pure argon to sputter etch the PCMO thin film has had some success, however, the same problem of poor selectivity of the PCMO thin film vs the mask material is present and unwanted etching of an underlying layer occurs.

A two-step, or multiple step, process has been used in the prior art, however, such techniques do not stop etching once the bottom electrode is reached, and results in residue being left on the stack sidewall, which residue is a direct result of etching the bottom electrode.

SUMMARY OF THE INVENTION

A one-mask etching method for use with a PCMO-containing RRAM to reduce stack side-wall residuals, includes preparing a substrate, taken from the group of substrates consisting of silicon, silicon dioxide and polysilicon; depositing a bottom electrode on the substrate; depositing a PCMO layer on the bottom electrode; depositing a top electrode on the PCMO layer; depositing a hard mask on the top electrode; depositing and patterning a photoresist layer on the hard mask; etching the hard mask; etching the top electrode using a first etching process having an etching atmosphere consisting of Ar, $O_2$, and $Cl_2$; etching the PCMO layer using an etching process taken from the group of etching processes consisting of the first etching process and a second etching process having an etching atmosphere consisting of Ar and $O_2$. etching the bottom electrode using the first etching process; and completing the RRAM device.

It is an object of the invention to provide a dry etching process for a Pt/PCMO/Pt stack using a single hard mask.

Another object of the invention is to provide a dry etch of a PCMO-containing stack which results in clean sidewalls and field.

A further object of the invention is to provide a dry etch which has high selectivity between the hard mask and any underlying layer.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

This invention resolves stack etching issues for electrode/perovskite/electrode stacks, such as $Pt/Pr_xCa_{1-x}MnO_3$ (PCMO)/Pt stacks, in that it minimizes the sidewall residue formed during an etching process. Two etching processes may be used in alternate steps during etching of a Pt/PCMO/Pt stack. The first etching process uses a gas mixture of Ar, $O_2$, and $Cl_2$, wherein $Cl_2$ may be replaced by $BCl_3$, $CCl_4$, $SiCl_4$, or combinations thereof. This process etches the platinum at a relatively high rate and results in less sidewall residue. In the case where platinum, or other noble metals, e.g., iridium or ruthenium, are used for both the top and bottom electrodes, this process is particularly suited for etching the top electrode and for etching the final portion of the PCMO, as the etching process approaches the bottom electrode. This process may also be used to etch a noble metal bottom electrode.

The second process uses a gas mixture of Ar and $O_2$, and is essentially a sputtering process, however, the second process has a much slower etch rate on SiN than does the first process, which allows a SiN film to be used as a etch stop layer when formed as part of a Pt/PCMO/SiN/Pt stack. The second process may also be used to etch the final portion of the PCMO, as the etching process approaches the bottom electrode, especially when a SiN, or other suitable, etch stop layer is provided.

Figure 1:
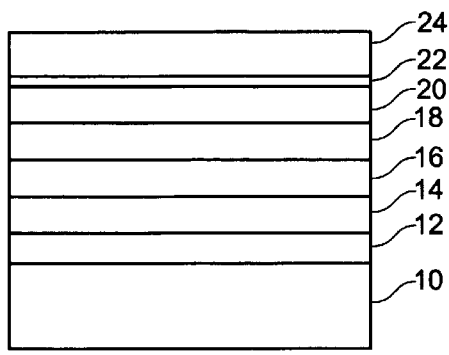
FIG. 1 is a block diagram of the method of the invention.
Figure 2:
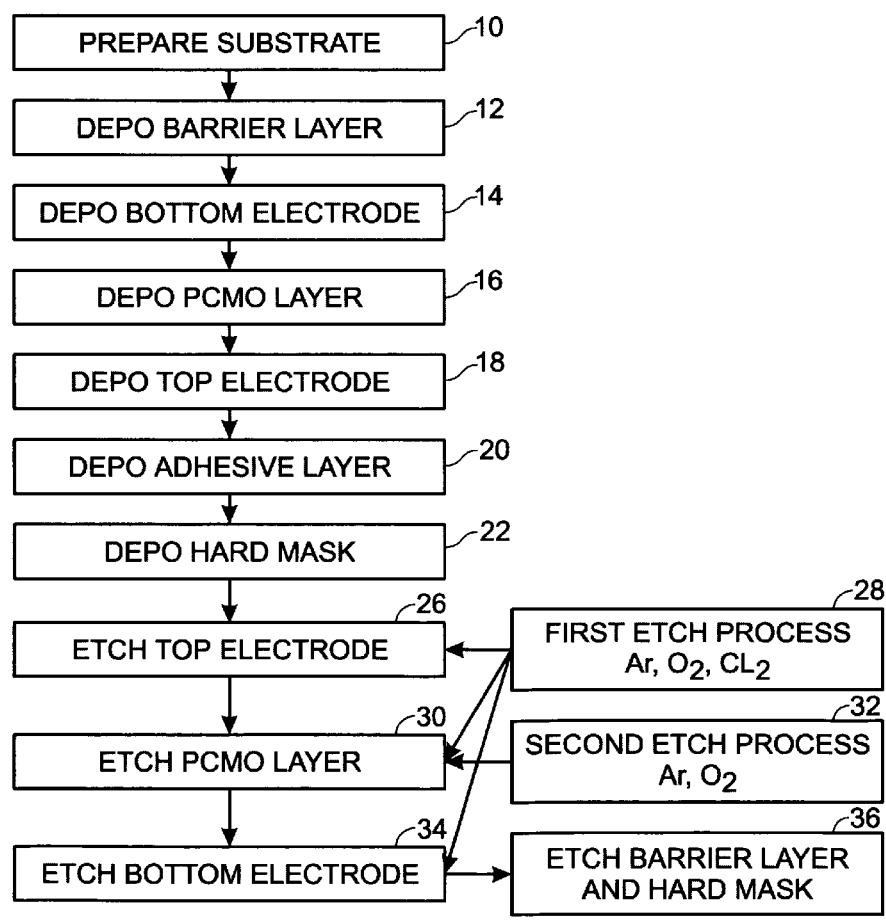
FIG. 2 is a cross-section of the layers of an RRAM to be etched by the method of the invention.

A device which is etched by the method of the invention is formed, and now referring to FIGS. 1 and 2, by initially preparing a substrate 10, which may be formed of silicon, silicon dioxide, or polysilicon, and, in some embodiments of the method of the invention, depositing a Ta, TaN, Ti, TiN, TIAlN, TaAlN, TiSiN, TaSiN or TiAl barrier layer, or etch stop layer, 12 thereon. A bottom electrode 14 of Pt, Ir, Ru, $IrO_2$, $RuO_2$ or $Y_xBa_2Cu_3O_{7-x}$ (YBCO) is deposited directly on the substrate or on the barrier layer. A perovskite thin film 16, such as PCMO, is deposited on the bottom electrode. A top electrode 18 of Pt, Ir, Ru, or their conducting oxides, is deposited on the PCMO layer, wherein the top electrode has a thickness of between about 10 nm to 300 nm. An optional adhesive thin layer 20 of Ti, e.g., between about 5 nm to 50 nm, may be used to enhance the adhesion between the top electrode and the hard mask. The hard mask, e.g., TiN, $TiO_2$, Ta, TaN, TiAlN, TaAlN, TiSiN, TaSiN or TiAl is deposited on top electrode 18. The thickness of the hard mask is between about 10 nm to 300 nm. Photoresist 24 is then deposited on the hard mask and developed with the required patterns. After the hard mask is etched, using convention etching processes, the photoresist is stripped, rendering the wafer ready for etching of the Pt/PCMO/Pt stack.

Etching the top electrode 26 includes using a first etching process using a gas mixture chemistry of Ar, $O_2$, and $Cl_2$. The $Cl_2$ gas can be replaced by $BCl_3$, $CCl_4$, $SiCl_4$, or their combinations. The total gas flow rate is between about 20 sccm to 100 sccm and is preferred to be a rate of between about 40 sccm to 70 sccm. The process pressure is between about 1 mtorr to 50 mtorr, and is preferred to be at a pressure of between about 3 mtorr. to 10 mtorr. The etching microwave power is between about 400 W to 1000 W, and the substrate RF bias power is between about 10 W to 1000 W. The substrate temperature may be maintained anywhere between −50° C. to 500° C. The percentage of the oxygen in the gas chemistry is in the range of between about 1% to 50%, and has a preferred range of between about 5% to 30%. The percentage of Ar in the gas chemistry is in the range of between about 5% to 80%, and has a preferred range of between about 40% to 80%. The remaining gas is $Cl_2$.

After the top electrode is etched, the same process may be used to etch PCMO 30. For PCMO etching, a two-step, or multiple-step, etching process is preferred. The first etching step uses Ar, $Cl_2$ and $O_2$ etching chemistry 28 to remove most of the PCMO thin film; the second etching process, or step, uses Ar and $O_2$ only ambient 32 to remove the remainder of the PCMO thin film. In the second etching process, the total gas flow rate is between about 20 sccm to 100 sccm and is preferred to be a rate of between about 40 sccm to 70 sccm. The process pressure is between about 1 mtorr to 50 mtorr, and is preferred to be at a pressure of between about 3 mtorr. to 10 mtorr. The etching microwave power is between about 400 W to 1000 W, and the substrate RF bias power is between about 10 W to 1000 W. The substrate temperature may be maintained anywhere between −50° C. to 500° C. These two steps may be alternately applied as many times as required when relatively short time etching step are used. The Ar, $Cl_2$ and $O_2$ etching chemistry has an etch rate which is higher than that of the Ar and $O_2$ only ambient, however, the Ar and $O_2$ only ambient leave less residual debris on the side wall and the field than does the Ar, $Cl_2$ and $O_2$ chemistry.

Although the two processes of the method of the invention may be applied alternately to remove a desired portion of the top electrode and a portion of the PCMO layer, the second process (Ar and $O_2$ only) should be used to remove the last vestige of the PCMO layer as this will produce less side wall residue. If however, the bottom electrode is formed of Pt, Ir, Ru, $IrO_2$, $RuO_2$, or YBCO, the first process (Ar, $O_2$ and $Cl_2$) is more suitable for etching both the last portion of the PCMO film and the bottom electrode, which process will produce less sidewall residue for this combination of materials.

If etch stop layer 12 is present, such as SiN, $SiO_2$, Ti, TiN, $TiO_2$, $HfO_2$, or $ZrO_2$, the second process etching chemistry is preferred to remove the last vestige of the PCMO layer above the etch stop layer, because of the slower etch rate of this chemistry on the barrier layer material, which slower etch rate, in this instance, results in less sidewall residual deposition than does the faster, first chemistry process. After the PCMO is etched, the bottom electrode may be etched 34 using the same process as used to etch the top electrode.

After the Pt/PCMO/Pt stack is etched, the hard mask and the barrier layer may be etched 36 using standard etching process. It is preferred to use the same material for both the hard mask and the barrier layer, having about the same thicknesses, such as Ti/TiN/Pt (bottom electrode)/PCMO/Pt (top electrode)/Ti/TiN stack, because the hard mask and the barrier layer may be etched in a single process. Otherwise, a two-step etching process may be required if the hard mask and the barrier layer are not formed of the same material.

In an alternate embodiment of the method of the invention, the hard mask layer may remain on top of the top electrode, if the device architecture will permit the presence of such a layer. In another embodiment of the method of the invention, the barrier layer may be patterned before placement on the bottom electrode, thus eliminating an extra etching step which would otherwise be required for the barrier layer removal.

This dry etching process can be applied to Ir/PCMO/Ir, Ru/PCMO/Ru, $IrO_2$/PCMO/$IrO_2$, and $RuO_2$/PCMO/$RuO_2$ capacitors.

Figure 3:
FIG. 3 is an etching profile of a stack having layers of: TiN(80 nm) /Pt(50 nm)/PCMO (150 nm) /Pt (150 nm) /Ti/Si.
Figure 4:
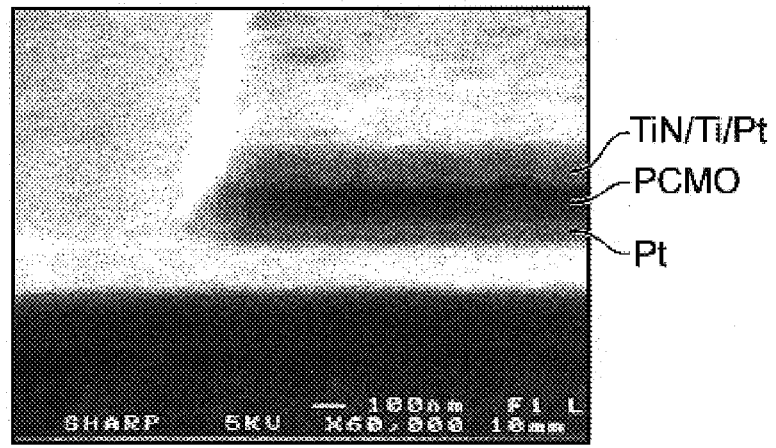
FIG. 4 is an etching profile of a stack having layers of: TiN (80 nm) /Pt(120 nm)/PCMO (180 nm)/Pt (100 nm)/Ti/Si.

An example of a device and the performance of the device constructed according to the method of the invention is now described. The etching system may be any state-of-the-art high-density plasma reactor. An example is an electron cyclotron resonance (EAR) plasma reactor. In this case, the ion density and ion energy in the plasma are controlled independently by adjusting the EAR microwave power and the RF bias power. The gas chemistry is Ar (40% to 80%), $O_2$ (5% to 30%) and $Cl_2$ (30% to 50%); the process pressure is between 3 mtorr and 10 mtorr; the microwave power is between 500 W and 800 W and the RF bias power is between 100 W and 400 W. The etching process was completed in three steps. The first step includes etching a Pt top electrode using the first process: $Cl_2$, Ar and $O_2$ ambient; the second step includes etching the PCMO thin film using alternating processes, e.g., using $Cl_2$+Ar+$O_2$ to etch the bulk of PCMO and then using Ar and $O_2$ gases for the second process, over-etching, step with the ratio of Ar/$O_2$ ranging from between about 90–50 to 10–50. The third step includes etching the bottom electrode using the same process as used to etch the top electrode. The forth step is an optional step, and includes etching the hard mask and the barrier layer, using standard process. FIG. 3 depicts an etching profile of a stack Pt/PCMO stack wherein the etching stopped at the upper surface of the bottom electrode. FIG. 4 depicts an etching profile of a Pt/PCMO/Pt stack wherein the etching stopped at a Ti barrier layer.

In further alternate embodiments of the method of the invention, TiN, $TiO_2$, Ta, TaN, TiAlN, TaAlN, TiSiN, TaSiN or TiAl may be used as the single hard mask to stack etch all of the top electrode/PCMO/bottom electrode, such as Pt/PCMO/Pt.

Thus, a one mask Pt/PCMO/Pt stack etching process for RRAM applications has been disclosed. It will be appreciated that further variations and modifications thereof may be made within the scope of the invention as defined in the appended claims.

We claim:

1. A one-mask etching method for use with a perovskite-containing RRAM to reduce stack side-wall residuals, comprising:

preparing a substrate;
depositing a bottom electrode on the substrate;
depositing a perovskite layer on the bottom electrode;
depositing a top electrode on the perovskite layer;
depositing a hard mask on the top electrode;
depositing and patterning a photoresist layer on the hard mask;
etching the hard mask;
etching the top electrode using a first etching process having an etching atmosphere consisting of Ar, $O_2$, and $Cl_2$;
etching the perovskite layer using an etching process taken from the group of etching processes consisting of the first etching process and a second etching process having an etching atmosphere consisting of Ar and $O_2$;
etching the bottom electrode using the first etching process; and
completing the RRAM device.

2. The method of claim 1 wherein the first etching process includes using a C-containing gas taken from the group of C-containing gases consisting of $Cl_2$, $BCl_3$, $CCl_4$, and $SiCl_4$, or their combinations; a percentage of Ar in the gas chemistry is in the range of between about 5% to 80%, with a preferred range of between about 40% to 80%; a percentage of oxygen in the gas chemistry in the range of between about 1% to 50%, with a preferred range of between about 5% to 30%; at a total gas flow rate of between about 20 sccm to 100 sccm, with a preferred rate of between about 40 sccm to 70 sccm; at a chamber pressure of between about 1 mtorr to 50 mtorr, with a preferred pressure of between about 3 mtorr. to 10 mtorr; an etching microwave power of between about 400 W to 1000 W, and a substrate RF bias power of between about 10 W to 1000 W; a substrate temperature in the range of between about −50° C. to 500° C.

3. The method of claim 2 wherein said depositing a bottom electrode includes depositing a bottom electrode taken from the group of electrode materials consisting of noble metals and their oxides, and which further includes using the first etching process to etch a final portion of the perovskite layer.

4. The method of claim 1 wherein the second etching process includes a percentage of Ar of between about 50% to 90%; and a percentage of $O_2$ of between about 10% to 50%; at a total gas flow rate of between about 20 sccm to 100 sccm, with a preferred rate of between about 40 sccm to 70 sccm; at a chamber pressure of between about 1 mtorr to 50 mtorr, with a preferred pressure of between about 3 mtorr. to 10 mtorr; an etching microwave power of between about 400 W to 1000 W, and a substrate RF bias power of between about 10 W to 1000 W; a substrate temperature in the range of between about −50° C. to 500° C.

5. The method of claim 4 which further includes depositing an etch stop layer on the bottom electrode and wherein said etching the perovskite layer includes etching a final portion of the perovskite layer using the second etching process.

6. The method of claim 1 wherein said etching of the perovskite layer includes a multi-step etching process, and wherein the first etching process is alternated with the second etching process.

7. The method of claim 1 which further includes, after preparation of the substrate, depositing a barrier layer on the substrate, and wherein said deposition of the bottom electrode includes deposition of the bottom electrode on the barrier layer.

8. The method of claim 1 which further includes, after deposition of the top electrode, depositing an adhesion layer on the top electrode; and wherein said deposition of the hard mask includes deposition of the hard mask on the adhesion layer.

9. The method of claim 1 which further includes leaving the hard mask in the RRAM device.

10. A one-mask etching method for use with a PCMO-containing RRAM to reduce stack side-wall residuals, comprising:
 preparing a substrate, taken from the group of substrates consisting of silicon, silicon dioxide and polysilicon;
 depositing a bottom electrode on the substrate;
 depositing a PCMO layer on the bottom electrode;
 depositing a top electrode on the PCMO layer;
 depositing a hard mask on the top electrode;
 depositing and patterning a photoresist layer on the hard mask;
 etching the hard mask;
 etching the top electrode using a first etching process having an etching atmosphere consisting of Ar, $O_2$, and $Cl_2$;
 etching the PCMO layer using an etching process taken from the group of etching processes consisting of the first etching process and a second etching process having an etching atmosphere consisting of Ar and $O_2$;
 etching the bottom electrode using the first etching process; and
 completing the RRAM device.

11. The method of claim 10 wherein the first etching process includes using a C-containing gas taken from the group of C-containing gases consisting of $Cl_2$, $BCl_3$, $CCl_4$, and $SiCl_4$, or their combinations; a percentage of Ar in the gas chemistry is in the range of between about 5% to 80%, with a preferred range of between about 40% to 80%; a percentage of oxygen in the gas chemistry in the range of between about 1% to 50%, with a preferred range of between about 5% to 30%; at a total gas flow rate of between about 20 sccm to 100 sccm, with a preferred rate of between about 40 sccm to 70 sccm; at a chamber pressure of between about 1 mtorr to 50 mtorr, with a preferred pressure of between about 3 mtorr. to 10 mtorr; an etching microwave power of between about 400 W to 1000 W, and a substrate RF bias power of between about 10 W to 1000 W; a substrate temperature in the range of between about −50° C. to 500° C.

12. The method of claim 11 wherein said depositing a bottom electrode includes depositing a bottom electrode taken from the group of electrode materials consisting of noble metals and their oxides, and which further includes using the first etching process to etch a final portion of the perovskite layer.

13. The method of claim 10 wherein the second etching process includes a percentage of Ar of between about 50% to 90%; and a percentage of $O_2$ of between about 10% to 50%; at a total gas flow rate of between about 20 sccm to 100 sccm, with a preferred rate of between about 40 sccm to 70 sccm; at a chamber pressure of between about 1 mtorr to 50 mtorr, with a preferred pressure of between about 3 mtorr. to 10 mtorr; an etching microwave power of between about 400 W to 1000 W, and a substrate RF bias power of between about 10 W to 1000 W; a substrate temperature in the range of between about −50° C. to 500° C.

14. The method of claim 13 which further includes depositing an etch stop layer on the bottom electrode and wherein said etching the perovskite layer includes etching a final portion of the perovskite layer using the second etching process.

15. The method of claim 10 wherein said etching of the perovskite layer includes a multi-step etching process, and wherein the first etching process is alternated with the second etching process.

16. The method of claim 10 which further includes, after preparation of the substrate, depositing a barrier layer on the substrate, and wherein said deposition of the bottom electrode includes deposition of the bottom electrode on the barrier layer.

17. The method of claim 10 which further includes, after deposition of the top electrode, depositing an adhesion layer on the top electrode; and wherein said deposition of the hard mask includes deposition of the hard mask on the adhesion layer.

18. The method of claim 10 which further includes leaving the hard mask in the RRAM device.

19. A one-mask etching method for use with a PCMO-containing RRAM to reduce stack side-wall residuals, comprising:
 preparing a substrate, taken from the group of substrates consisting of silicon, silicon dioxide and polysilicon;

depositing a bottom electrode on the substrate, wherein the material for the bottom electrode is taken from the group of electrode materials consisting of Pt, Ir, Ru, $IrO_2$, $RuO_2$ and $Y_xBa_2Cu_3O_{7-x}$;

depositing a PCMO layer on the bottom electrode;

depositing a top electrode on the PCMO layer, wherein the top electrode is formed of material taken from the group of electrode materials consisting of Pt, Ir, Ru, and their conducting oxides;

depositing a hard mask on the top electrode, wherein the hard mask is formed of material taken from the group of materials consisting of TiN, $TiO_2$, Ta, TaN, TiAlN, TaAlN, TiSiN, TaSiN, and TiAl;

depositing and patterning a photoresist layer on the hard mask;

etching the hard mask;

etching the top electrode using a first etching process having an etching atmosphere consisting of Ar, $O_2$, and $Cl_2$;

etching the PCMO layer using an etching process taken from the group of etching processes consisting of the first etching process and a second etching process having an etching atmosphere consisting of Ar and $O_2$;

etching the bottom electrode using the first etching process; and completing the RRAM device.

20. The method of claim 19 wherein the first etching process includes using a C-containing gas taken from the group of C-containing gases consisting of $Cl_2$, $BCl_3$, $CCl_4$, and $SiCl_4$, or their combinations; a percentage of Ar in the gas chemistry is in the range of between about 5% to 80%, with a preferred range of between about 40% to 80%; a percentage of oxygen in the gas chemistry in the range of between about 1% to 50%, with a preferred range of between about 5% to 30%; at a total gas flow rate of between about 20 sccm to 100 sccm, with a preferred rate of between about 40 sccm to 70 sccm; at a chamber pressure of between about 1 mtorr to 50 mtorr, with a preferred pressure of between about 3 mtorr. to 10 mtorr; an etching microwave power of between about 400 W to 1000 W, and a substrate RF bias power of between about 10 W to 1000 W; a substrate temperature in the range of between about −50° C. to 500° C.

21. The method of claim 20 wherein said depositing a bottom electrode includes depositing a bottom electrode taken from the group of electrode materials consisting of noble metals and their oxides, and which further includes using the first etching process to etch a final portion of the perovskite layer.

22. The method of claim 19 wherein the second etching process includes a percentage of Ar of between about 50% to 90%; and a percentage of $O_2$ of between about 10% to 50%; at a total gas flow rate of between about 20 sccm to 100 sccm, with a preferred rate of between about 40 sccm to 70 sccm; at a chamber pressure of between about 1 mtorr to 50 mtorr, with a preferred pressure of between about 3 mtorr. to 10 mtorr; an etching microwave power of between about 400 W to 1000 W, and a substrate RF bias power of between about 10 W to 1000 W; a substrate temperature in the range of between about −50° C. to 500° C.

23. The method of claim 22 which further includes depositing an etch stop layer on the bottom electrode and wherein said etching the perovskite layer includes etching a final portion of the perovskite layer using the second etching process.

24. The method of claim 19 wherein said etching of the PCMO layer includes a multi-step etching process, and wherein the first etching process is alternated with the second etching process.

25. The method of claim 19 which further includes, after preparation of the substrate, depositing a barrier layer on the substrate, and wherein said deposition of the bottom electrode includes deposition of the bottom electrode on the barrier layer, wherein the barrier layer is formed of material taken from the group of materials consisting of Ta, TaN, Ti, TiN, TiAlN, TaAlN, TiSiN, TaSiN, TiAl, and TiAlN.

26. The method of claim 19 which further includes, after deposition of the top electrode, depositing an adhesion layer on the top electrode; and wherein said deposition of the hard mask includes deposition of the hard mask on the adhesion layer, wherein the adhesion layer is formed of Ti; and which further includes leaving the hard mask in the RRAM device.

* * * * *